United States Patent [19]

Yoshida

[11] Patent Number: 5,587,328

[45] Date of Patent: Dec. 24, 1996

[54] METHOD FOR MANUFACTURING SEMICONDUCTOR DEVICE

[75] Inventor: Kazuhiro Yoshida, Shiga-ken, Japan

[73] Assignee: Murata Manufacturing Co., Ltd., Japan

[21] Appl. No.: 572,876

[22] Filed: Dec. 18, 1995

[30] Foreign Application Priority Data

Dec. 20, 1994 [JP] Japan .................................. 6-317019

[51] Int. Cl.$^6$ ................................ H01L 21/265
[52] U.S. Cl. ................ 437/40; 437/41; 437/39; 437/175; 437/912; 148/DIG. 100
[58] Field of Search ................... 437/40, 41, 39, 437/44, 175, 229, 912; 148/DIG. 100

[56] References Cited

U.S. PATENT DOCUMENTS

| | | | |
|---|---|---|---|
| 4,358,891 | 11/1982 | Roesner | 437/912 |
| 5,037,505 | 8/1991 | Tung | 437/41 |
| 5,185,277 | 2/1993 | Tung et al. | 437/40 |
| 5,288,660 | 2/1994 | Hua et al. | 437/912 |
| 5,486,483 | 1/1996 | Lammert | 437/40 |

*Primary Examiner*—Tuan H. Nguyen
*Attorney, Agent, or Firm*—Ostrolenk, Faber, Gerb & Soffen, LLP

[57] ABSTRACT

A semiconductor device manufacturing method with which a GaAs MESFET and an integrated circuit using the same can be manufactured cheaply and with high yield by accurately forming a mushroom-shaped gate electrode with inexpensive equipment and a short process. The method includes the steps of: depositing a first mask layer on a semiconductor substrate; forming an opening in the first mask layer; causing the first mask layer to flow by heat-treating the semiconductor substrate; depositing a second mask layer on the first mask layer; forming in the second mask layer an opening larger than the opening in the first mask layer and exposing the opening in the first mask layer; and forming a gate electrode in the opening in the second mask layer.

15 Claims, 2 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more particularly to a method for manufacturing a semiconductor device having a mushroom-shaped gate electrode, such as a Schottky gate field effect transistor or an integrated circuit including a Schottky gate field effect transistor.

2. Description of the Related Art

Gallium arsenide Schottky gate field effect transistors (hereinafter referred to as GaAs MESFETs) have excellent high frequency characteristics and can have high outputs. To realize MESFETs of high performance (high frequency, high output, high efficiency) and high reliability, various structures and manufacturing methods have been proposed.

To obtain high performance, for example reducing the gate resistance ($R_g$), the source resistance ($R_s$) and the source-drain capacitance ($C_{gs}$) and increasing the transmitting conductance ($g_m$) are important. To reduce the source-drain capacitance ($C_{gs}$) and increase the transmitting conductance ($g_m$), it is effective to reduce the gate length. To prevent increasing of the gate resistance ($R_g$) resulting from reduction of the gate length, a mushroom-shaped gate electrode is effective.

A conventional method for manufacturing a GaAs MESFET having a mushroom-shaped gate electrode is disclosed in Japanese Patent Publication No. 4-72381.

FIGS. 2(a) to 2(d) are sectional views illustrating a conventional method for manufacturing a GaAs MESFET having a mushroom-shaped gate electrode.

First, an active layer 22 is formed by epitaxial growth or ion implantation in the upper part of a semiconductor substrate 21 made of semi-insulating GaAs. Then, a source electrode 23 and a drain electrode 24 are formed on the active layer 22, an insulating film 25 and a resist layer 26 which is a first mask layer are successively deposited. An opening 26a is formed in a part of the resist layer 26 corresponding to a region where a gate electrode is to be formed (FIG. 2(a)).

Next, an opening window 25a is formed in the insulating film 25 by selectively etching the insulating film 25 using the resist layer 26 having the opening 26a as a mask (FIG. 2(b)).

The resist layer 26 is then removed, and another resist layer 27 which is a second mask layer is deposited. An opening 27a wider than the opening window 25a is formed in the resist layer 27. A recess 28 is then formed in the active layer 22 by etching the active layer 22 using the resist layer 27 and the insulating film 25 as a mask (FIG. 2(c)).

Finally, metal constituting a gate electrode 29 is formed on the semiconductor substrate 21 by a vapor deposition method, the resist layer 27 is removed and the metal film thereon is thereby also removed, and a GaAs MESFET 20 having a mushroom-shaped gate electrode 29 is obtained (FIG. 2(d)).

However, in this kind of manufacturing method, when wet etching with phosphoric acid or sulfuric acid is used to etch the insulating film 25, some slight nonuniformity of the amount of etching occurs over the substrate surface and among different lots. Thus, the intended width of the opening is not always obtained and uniformity is also sometimes poor. As a result there has been the problem that the device characteristics are nonuniform over the substrate surface and among different lots.

To make the amount of etching, i.e. the width of the opening window 25a, more uniform, dry etching such as reactive ion etching or ion milling can be used. However, in these cases there has been the problem that the surface of the active layer 22 is damaged and the device characteristics consequently deteriorate.

Also, this kind of manufacturing requires the steps of successively depositing the insulating film 25 and the resist layer 26 which is a first mask layer, forming the opening 26a in the resist layer 26, forming the opening window 25a in the insulating film 25 and then removing the resist layer 26, depositing the other resist layer 27 which is a second mask layer, and forming the opening 27a in the resist layer 27. Consequently there has been the problem that the process is complicated and cost is high.

SUMMARY OF THE INVENTION

It is an object of the present invention to provide a method for manufacturing a semiconductor device which solves the above-mentioned problems and with which a GaAs MESFET and an integrated circuit using the same can be manufactured cheaply and with high yield by accurately forming a mushroom-shaped gate electrode with inexpensive equipment and a less complicated process.

To solve the above-mentioned problems, the invention provides a method for manufacturing a semiconductor device. The method includes the steps of: depositing a first mask layer on a semiconductor substrate; forming an opening in the first mask layer; causing the first mask layer to flow by heat-treating the semiconductor substrate; depositing a second mask layer on the first mask layer; forming an opening in the second mask layer larger than the opening in the first mask layer and exposing the opening in the first mask layer; and depositing metal constituting a gate electrode in the opening in the second mask layer.

In a semiconductor device manufacturing method according to the invention, because no step of forming an opening in an insulating film by etching is employed, the gate length is determined only by the width of the opening in a resist layer constituting the first mask layer. As a result, it is possible to form the opening in the resist layer with good control of the width of the opening without damaging the surface of an active layer directly below the gate electrode.

Also, because there is no step of forming an opening in an insulating film and no step of removing the resist film constituting the first mask layer, the process can be simplified.

Other features and advantages of the present invention will become apparent from the following description of the invention which refers to the accompanying drawings.

DETAILED DESCRIPTION OF THE INVENTION

FIGS. 1(a) to 1(d) are sectional views illustrating a method for manufacturing a GaAs MESFET having a mushroom-shaped gate electrode according to a preferred embodiment of the invention, and the manufacturing method is described below.

Figure 1A:
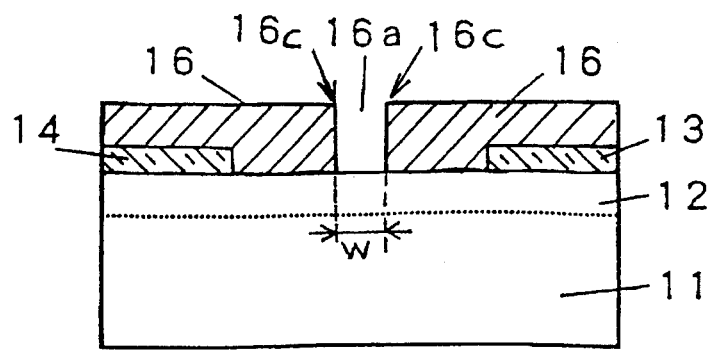
FIGS. 1(a) to 1(d) are sectional views illustrating a method of manufacturing a GaAs MESFET according to a preferred embodiment of the invention.

First, as shown in FIG. 1(a), an active layer 12 is formed by epitaxial growth or ion implantation in the upper part of a semiconductor substrate 11 made of semi-insulating GaAs. More specifically, the active layer 12 is epitaxially grown on a semi-insulating GaAs substrate by the MBE (molecular beam epitaxy) method, the MOCVD (metal organic chemical vapor deposition) method, or another suitable method, so that the semiconductor substrate 11 having the active layer 12 is prepared. Alternatively, the active layer 12 is formed in the surface region of the semiconductor substrate 11 by implanting impurity ions in the surface region of the semiconductor substrate 11 and activating the ions. Thereafter, a source electrode 13 and a drain electrode 14 are formed on the active layer 12.

Photoresist is then applied on the entire upper surface of the semiconductor substrate 11 to form a resist film (not shown) on the semiconductor substrate 11. It is preferable that the photoresist is a positive type. The resist film can be formed with any suitable thickness having high exposure sensitivity for an I-line stepper. Then, the resist film is exposed with an I-line light beam through a photomask or a reticle defining an opening 16a on the resist film. After exposing, the resist film is developed by an appropriate etchant, thereby obtaining a resist layer 16 which is a first mask layer. The resist layer 16 has the opening 16a which is formed in a part of the resist layer 16 corresponding to a region where a gate electrode is to be formed.

Figure 1B:
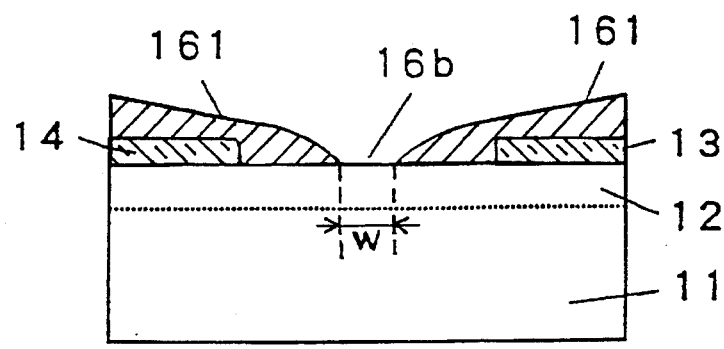

Next, as shown in FIG. 1(b), the semiconductor substrate 11 is heat-treated at a temperature, for example at 200° C., for 30 minutes. During the heat treatment, the resist layer 16 flows and deforms, and corners 16c of the resist layer 16 become rounded. Since the resist layer 16 mainly deforms at the corners 16c, a pattern width w does not substantially change during the heat treatment. As a result, a rounded resist layer 161 having an opening window 16b is formed on the semiconductor substrate 11.

In this step, it is preferable that the temperature of the heat-treatment is sufficiently higher than a temperature at which a post-baking process is usually performed after developing a resist pattern. This is because such a post-baking process does not cause substantial deformation of a resist pattern.

Figure 1C:
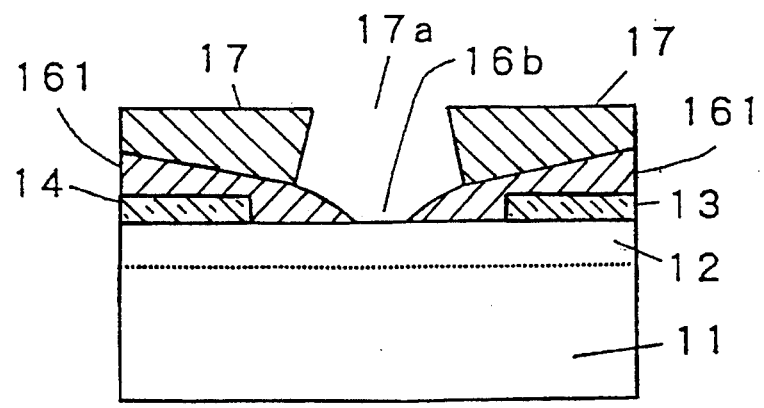

Then, another resist film is applied over the resist layer 161 having the opening window 16b. The resist film is exposed with a light beam through a photomask or a reticle defining opening 17a. The resist film is developed using a etchant, whereby a resist layer 17 which is a second mask layer and having an opening 17a wider than the opening window 16b is formed, as shown in FIG. 1(c). At this time, a negative resist or a multilayer resist can be used for the resist layer 17 which is a second mask layer to facilitate its lift-off in a later step.

Since the resist layer 161 has be subjected to heat treatment, its characteristics with respect to exposure and development have changed, so that the resist layer 161 is insensitive to a light beam used in an exposure process and a etchant used in a development process for forming the resist layer 17. Thus, the resist layer 161 neither changes in shape nor mixes with the resist layer 17 during the formation of the resist layer 17.

Figure 1D:
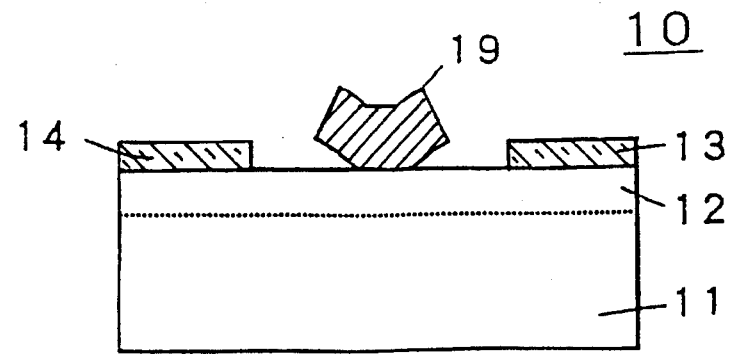
Figure 2A:
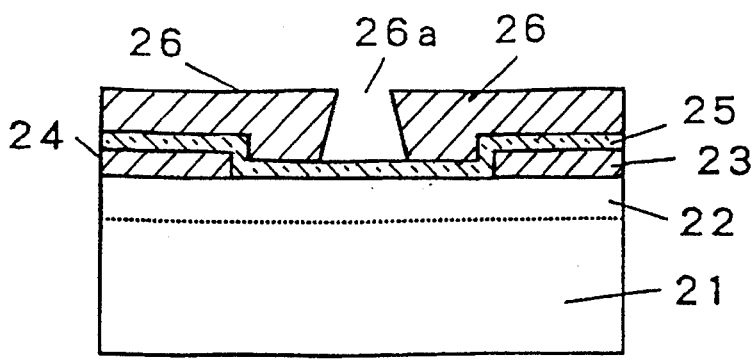
FIGS. 2(a) to 2(d) are sectional views illustrating a conventional method of manufacturing a GaAs MESFET.
Figure 2B:
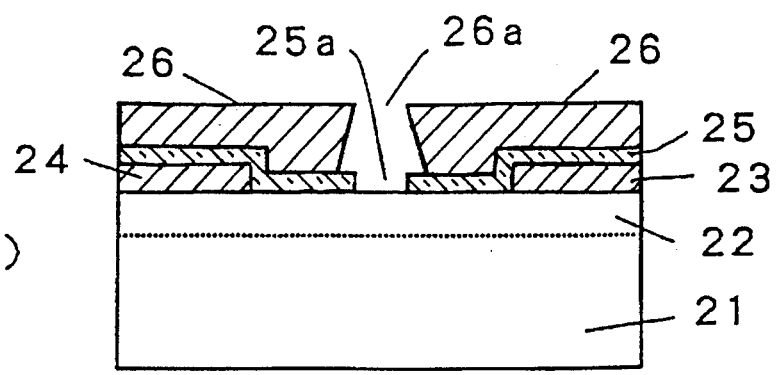
Figure 2C:
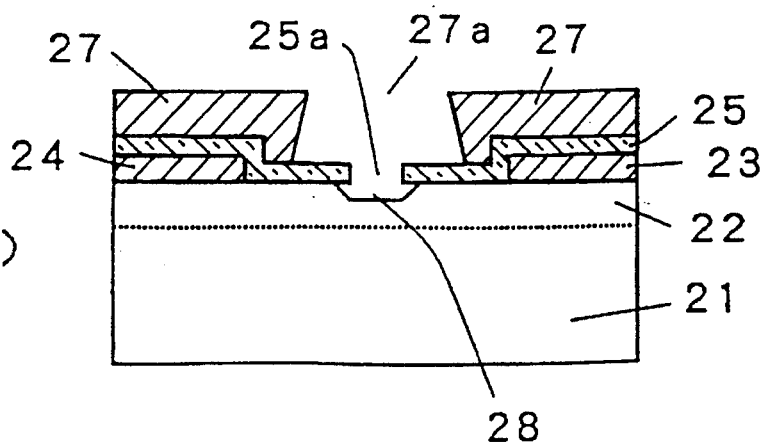
Figure 2D:
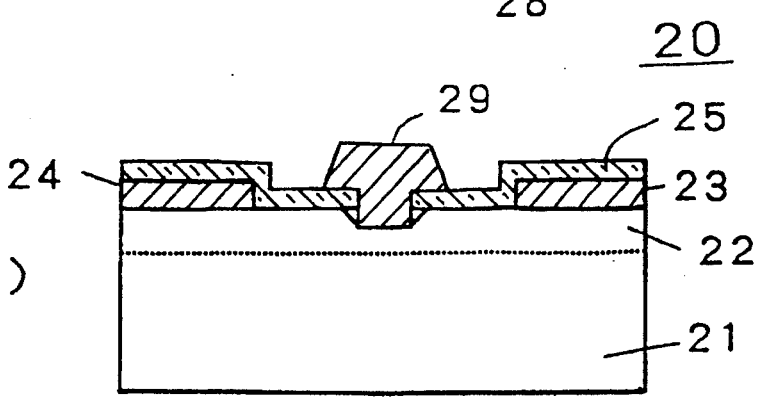

Finally, as shown in FIG. 1(d), metal constituting a gate electrode, for example Ti (titanium) Pt (platinum)/Au (gold) is formed on the semiconductor substrate 11 by a vapor deposition, and the resist layer 161 which is a first mask layer and the resist layer 17 which is a second mask layer are simultaneously removed using an organic solvent. At this time, the metal film formed on the resist layers 161 and 17 is also removed. Since the resist layer 161 is round at the corners, a GaAs MESFET 10 having a mushroom-shaped gate electrode 19 is successfully obtained without the cap being ripped from the post of the mushroom-shaped gate electrode 19.

Although not shown in FIGS. 1(a) to 1(c), the active layer 12 can also be etched with the resist layer 16 or 161 as a mask by wet etching so as to form a recess structure before depositing the metal.

Although a preferred embodiment described above is a case wherein the invention is applied to the manufacture of a MESFET, the invention can also be applied to a high electron mobility transistor (HEMT).

Also, although in the preferred embodiment described above GaAs was used for the semiconductor substrate, the invention can also be applied in cases wherein other semiconductor substrates such as those made of Si or InP are used.

As described above, with a semiconductor device manufacturing method according to the invention, because it is possible to form an opening in a resist layer with good control of the width of the opening and without damaging the surface of an active layer directly below a gate electrode, mushroom-shaped gate electrodes having uniform gate lengths can be made. As a result, reduction of the source-drain capacitance ($C_{gs}$), increase of the mutual conductance ($g_m$) and reduction of the gate resistance ($R_g$) are possible.

Also, it is possible to manufacture a MESFET and an integrated circuit using the same method, the reproducibility and uniformity of whose device characteristics, for example mutual conductance ($g_m$), source-drain current ($I_{dss}$) and pinch-off voltage ($V_p$), within its surface and among lots, are excellent.

Furthermore, because it is possible to shorten the process by which a mushroom-shaped gate electrode is made, manufacturing costs and materials costs can be greatly reduced.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for manufacturing a semiconductor device comprising the steps of:

depositing a first mask layer on a semiconductor substrate;

forming an opening in the first mask layer;

causing the first mask layer to flow by heat-treating the semiconductor substrate;

depositing a second mask layer on the first mask layer;

forming in the second mask layer an opening larger than the opening in the first mask layer and exposing the opening in the first mask layer; and depositing metal in the opening in the second mask layer, to form a first electrode on said semiconductor substrate.

2. A method for manufacturing a semiconductor device as in claim 1, further comprising the step of depositing at least one additional electrode on said semiconductor substrate before depositing said first mask layer.

3. A method for manufacturing a semiconductor device as in claim 2, wherein said at least one additional electrode comprises a drain electrode and a source electrode of a MESFET and said first electrode is a gate electrode of said MESFET.

4. A method for manufacturing a semiconductor device as in claim 1, wherein said first mask layer with said opening therein is formed by the steps of depositing a first photoresist film on said semiconductor substrate, exposing a portion of said first photoresist film to a suitable light beam defining said opening, and developing said photoresist film with a suitable etchant, said developed photoresist film being said first mask layer with said opening therein.

5. A method for manufacturing a semiconductor device as in claim 4, wherein said first photoresist film is made of a positive-type photoresist.

6. A method for manufacturing a semiconductor device as in claim 1, wherein said heat-treating step causes edges of said first mask layer to become rounded.

7. A method for manufacturing a semiconductor device as in claim 6, wherein said heat-treating step does not substantially change a shape of said opening in the first mask layer.

8. A method for manufacturing a semiconductor device as in claim 1, wherein said heat-treating step is carried out at a temperature substantially higher than a temperature of a conventional post-baking process performed on a resist film.

9. A method for manufacturing a semiconductor device as in claim 8, wherein said heat-treating step is carried out at 200° C.

10. A method for manufacturing a semiconductor device as in claim 1, wherein said second mask layer and said opening therein are formed by depositing, exposing and developing a second photoresist film.

11. A method for manufacturing a semiconductor device as in claim 10, wherein said second photoresist film is made of a negative-type photoresist.

12. A method for manufacturing a semiconductor device as in claim 10, wherein said second photoresist film is made of a multilayer photoresist.

13. A method for manufacturing a semiconductor device as in claim 10, wherein said heat-treating step causes said first mask layer to be insensitive to a light beam and an etchant used in forming said second mask layer.

14. A method for manufacturing a semiconductor device as in claim 1, wherein said first and second mask layers are formed by depositing, exposing and etching a photoresist, and said heat-treating step causes said first mask layer to be insensitive to a light beam and an etchant used in forming said second mask layer.

15. A method for manufacturing a semiconductor device as in claim 1, wherein said opening in said first mask layer does not substantially extend into said semiconductor substrate below said first mask layer.

* * * * *